(12) United States Patent
Ku et al.

(10) Patent No.: US 10,263,064 B2
(45) Date of Patent: Apr. 16, 2019

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Chin-Yu Ku, Hsinchu (TW); Chien-Chih Chou, New Taipei (TW); Chen-Shien Chen, Hsinchu (TW); Hon-Lin Huang, Hsinchu (TW); Chi-Cheng Chen, Tainan (TW); Kuang-Yi Wu, Changhua (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/638,387

(22) Filed: Jun. 30, 2017

(65) Prior Publication Data
US 2019/0006455 A1  Jan. 3, 2019

(51) Int. Cl.
*H01L 23/522* (2006.01)
*H01L 49/02* (2006.01)
*H01L 23/00* (2006.01)

(52) U.S. Cl.
CPC ............ *H01L 28/10* (2013.01); *H01L 23/522* (2013.01); *H01L 24/13* (2013.01); *H01L 2924/1206* (2013.01)

(58) Field of Classification Search
CPC ....... H01L 28/10; H01L 24/13; H01L 23/522; H01L 2924/1206

USPC .......................................................... 257/531
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0099259 A1* | 5/2005 | Harris | H01L 23/5227 336/200 |
| 2008/0003760 A1* | 1/2008 | Gardner | H01F 10/16 438/381 |

* cited by examiner

*Primary Examiner* — Fernando L Toledo
*Assistant Examiner* — Adam S Bowen
(74) *Attorney, Agent, or Firm* — JCIPRNET

(57) ABSTRACT

Semiconductor devices and methods of forming the same are disclosed. One of the semiconductor device includes an inductor structure, and the inductor structure is on a substrate and includes a first metal layer, a magnetic stack, a polymer layer and a second metal layer. The first metal layer is over the substrate. The magnetic stack is over the first metal layer and has a substantially zigzag shaped sidewall. The polymer layer is over the first metal layer and encapsulates the magnetic stack. The second metal layer is over the polymer layer.

20 Claims, 17 Drawing Sheets

SEMICONDUCTOR DEVICES AND METHODS OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

Generally, an inductor is a passive electrical component that can store energy in a magnetic field created by an electric current passing through it. Inductors may be utilized in a wide variety of applications. However, there are many challenges related to inductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 3 is a simplified top view of an inductor structure in accordance with some embodiments, wherein FIG. 2 is a cross-sectional view taken along line A-A of FIG. 3.

DETAILED DESCRIPTION

Figure 1:
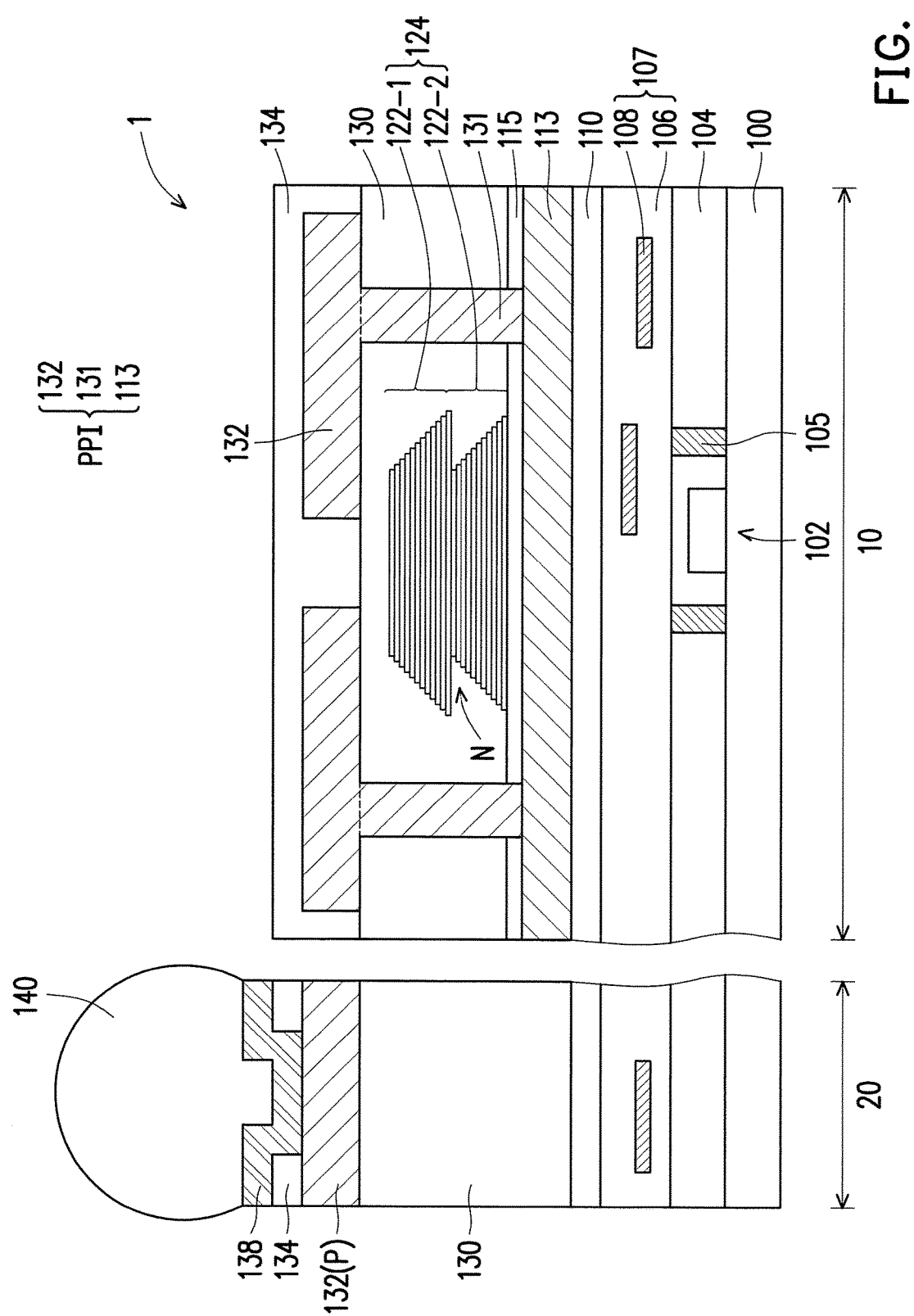
FIG. 1 is a schematic cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
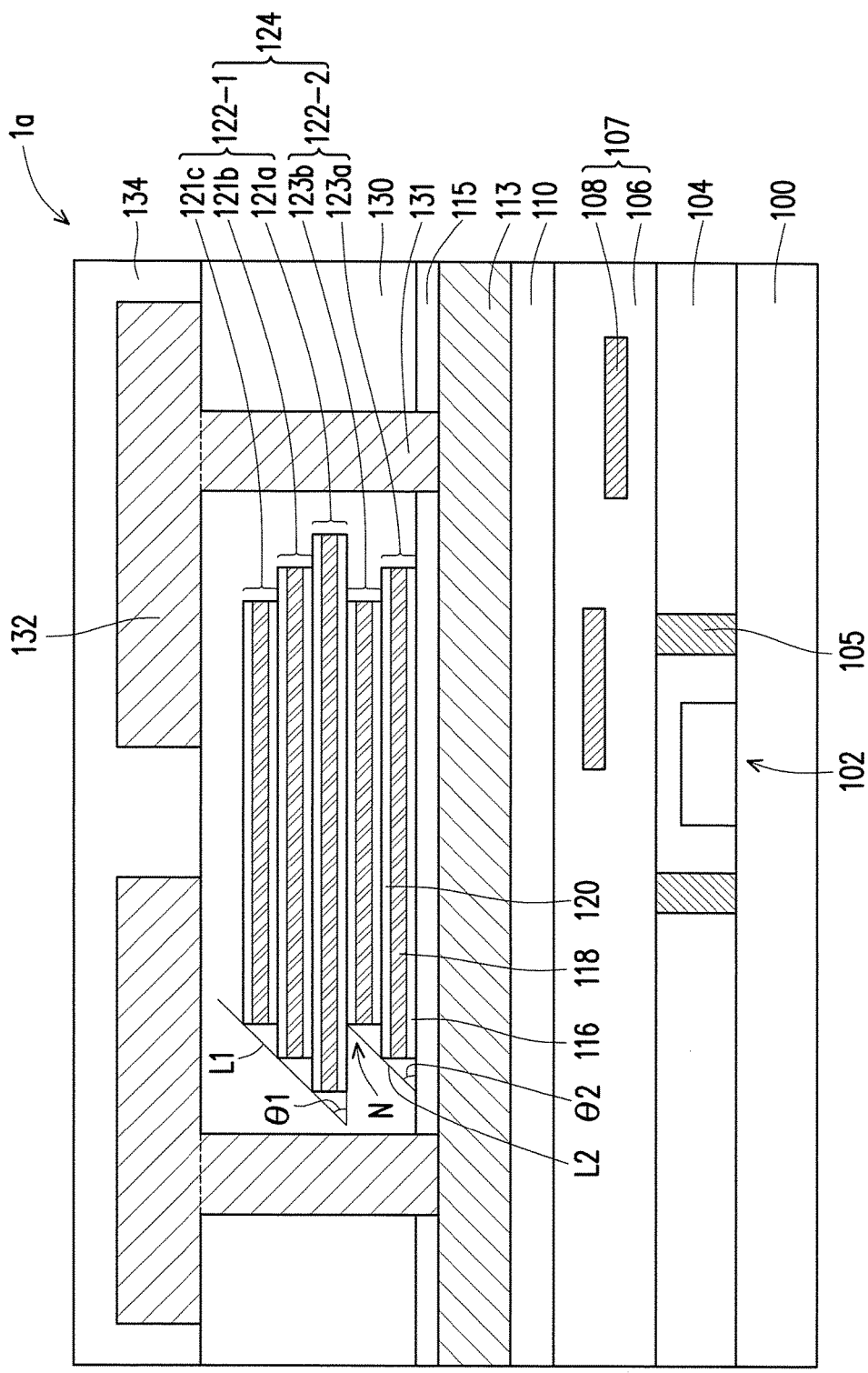
FIG. 2 is a schematic cross-sectional view of an inductor structure in accordance with some embodiments.
Figure 3:
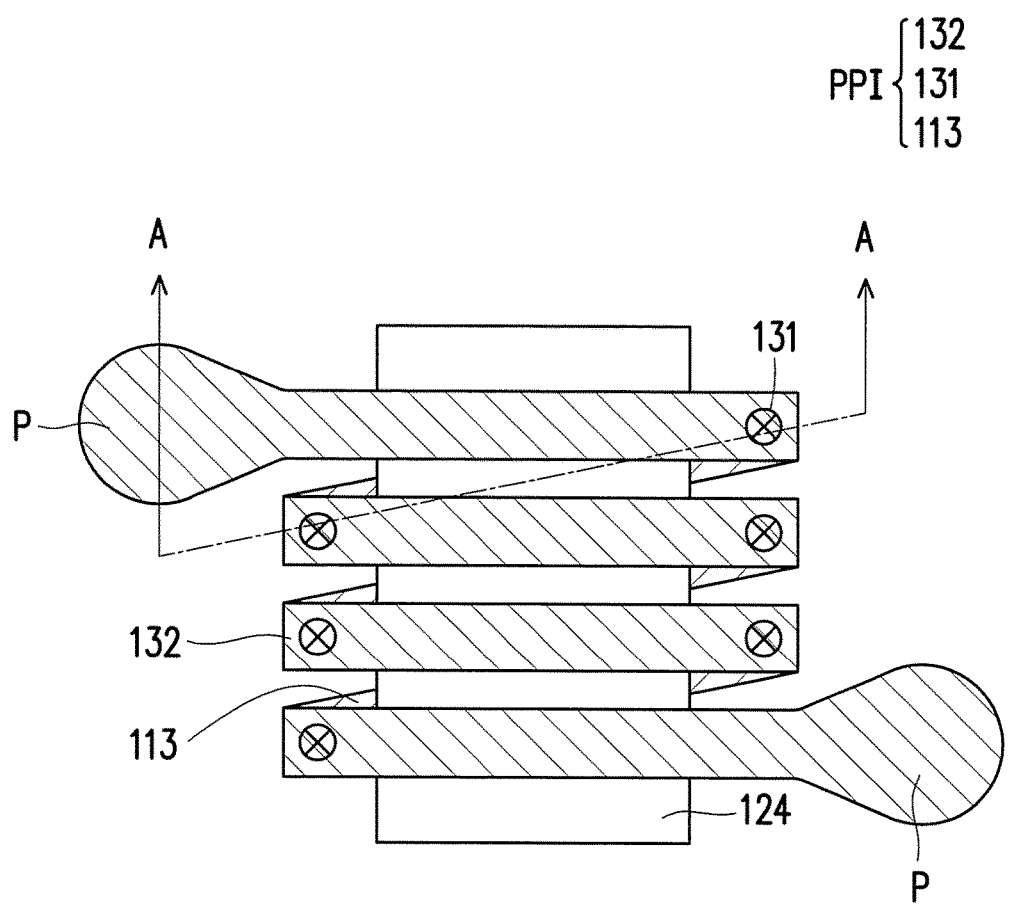

FIG. 1 is a schematic cross-sectional view of a semiconductor device in accordance with some embodiments. FIG. 2 is a schematic cross-sectional view of an inductor structure in accordance with some embodiments. FIG. 3 is a simplified top view of an inductor structure in accordance with some embodiments, wherein FIG. 2 is a cross-sectional view taken along line A-A of FIG. 3.

Referring to FIG. 1 and FIG. 2, a substrate 100 is provided. In some embodiments, the substrate 100 is a semiconductor substrate, such as a silicon substrate, a silicon-on-insulator (SOI) substrate, a silicon germanium substrate, or a substrate formed of other suitable semiconductor materials. Depending on the requirements of design, the substrate 100 may be a P-type substrate or an N-type substrate and may have doped regions therein.

The substrate 100 may have a first area 10 and a second area 20 adjacent to the first area 10. In some embodiments, the first area 10 is an inductor area where an inductor structure is formed, and the second area 20 is a package area configured to bond the inductor structure to an application specific integrated circuit (ASIC). In some embodiments, the second area 20 provides an electrical connection where an electrical connector (e.g., a ball/bump) may be placed.

An electrical circuit 102 is formed on the substrate 100 in the first area 10. In some embodiment, the electrical circuit 102 includes gate stacks formed by dielectric layers and electrode layers. The dielectric layers may include an interfacial layer (IL) and a high-k layer having a dielectric constant greater than about 4, greater than about 8 or even greater than about 10. The dielectric layers are deposited by suitable techniques, such as chemical vapor deposition (CVD), atomic layer deposition (ALD), physical vapor deposition (PVD), thermal oxidation, a combination thereof, or the like. The electrode layers may include a single layer or multiple layers, such as a metal layer, a liner layer, a wetting layer, an adhesion layer, a combination thereof, or the like, and may be formed by ALD, PVD, CVD or the like.

An inter-layer dielectric (ILD) layer 104 is formed over the substrate 100 in the first and second areas 10 and 20. In some embodiments, the ILD layer 104 covers the electrical circuit 102. In some embodiments, the ILD layer 104 includes a low-k dielectric material having a dielectric constant less than about 4, less than about 3.5 or even less than about 3. The low-k material includes phosphosilicate glass (PSG), borophosphosilicate glass (BPSG), fluorinated silicate glass (FSG), silicon oxycarbide ($SiO_xC_y$), Spin-On-Glass (SOG), Spin-On-Polymer (SOP), a combination thereof, or the like. The ILD layer 104 may be formed by a suitable method, such as spinning, CVD or plasma-enhanced CVD (PECVD). The ILD layer 104 may have a single-layer or multi-layer structure.

Contacts 105 are formed through the ILD layer 104 to provide electrical contacts to the electrical circuit 102. In some embodiments, openings are formed in the ILD layer 104 by photolithography and etching processes. The openings may be lined with a diffusion barrier layer and/or an adhesion layer (not shown), and filled with a conductive material. In some embodiments, the diffusion barrier layer includes TaN, Ta, TiN, Ti, CoW, a combination thereof, or the like, and the conductive material includes copper, tungsten, aluminum, silver, a combinations thereof, or the like.

An interconnect structure 107 is formed over the substrate 100 in the first and second areas 10 and 20. In some embodiments, the interconnect structure 107 is formed on the ILD layer 104. In some embodiments, the interconnect structure 107 includes one or more inter-metal dielectric (IMD) layers 106 and the associated metallization features 108 (e.g., metal layers and vias) embedded in the IMD layers 106. Generally, the one or more IMD layers 106 and the associated metallization features 108 are used to interconnect the electrical circuit 102 to each other and to provide an external electrical connection. The IMD layers 106 include a low-k dielectric material having a dielectric constant less than about 4, less than about 3.5 or even less than about 3. The low-k material includes PSG, BPSG, FSG, $SiO_xC_y$, SOG, SOP, a combination thereof, or the like. The IMD layers 106 be formed by a suitable method, such as spinning, CVD or PECVD.

In some embodiments, one or more insulating etch stop layers (not shown) may be positioned between adjacent ones of the dielectric layers, e.g., the ILD layer 104 and the IMD layers 106. The insulating etch stop layers are formed of a dielectric material having a different etch selectivity from adjacent layers. In some embodiments, the insulating etch stop layers may be formed of SiN, SiCN, SiCO, a combination thereof, or the like, and may be formed by a suitable method, such as CVD or PECVD.

A passivation layer 110 is formed over the substrate 100 in the first and second areas 10 and 20. In some embodiments, the passivation layer 110 is formed on the IMD layers 106. In some embodiments, the passivation layer 110 may be formed of a dielectric material, such as SiN, a plasma-enhanced oxide (PEOX), a plasma-enhanced SiN (PE-SiN), plasma-enhanced undoped silicate glass (PE-USG), a high density plasma (HDP) chemical vapor deposition (CVD) oxide, a combination thereof, or the like. The passivation layer 110 is formed to protect the underlying layers from various environmental contaminants.

An inductor structure 1/1a is then formed on the substrate 100 in the first area 10. In some embodiments, the inductor structure 1/1a includes a post-passivation interconnect structure PPI over the substrate 100 and being a spiral (as shown in FIG. 3), and a magnetic stack 124 in a central region of the spiral.

In some embodiments, the post-passivation interconnect structure PPI includes copper or a copper alloy. In alternative embodiments, the post-passivation interconnect structure PPI may include a copper layer coated with electro-less nickel electro-less palladium immersion gold (ENEPIG), which includes a nickel layer, a palladium layer on the nickel layer, and a gold layer on the palladium layer. The gold layer may be formed using immersion plating. In yet alternative embodiments, other conductive materials may be used to form the post-passivation interconnect structure PPI. In some embodiments, the post-passivation interconnect structure PPI may be called a redistribution layer (RDL).

In some embodiments, the post-passivation interconnect structure PPI includes a first metal layer 113, a second metal layer 132 and a plurality of vias 131 therebetween. Specifically, the second metal layer 132 is electrically connected to the first metal layer 113 through the vias 131, and the first metal layer 113, the vias 131 and the second metal layer 132 constitute a spiral structure, as shown in FIG. 3.

In some embodiments, the inductor structure 1/1a includes the first metal layer 113, the magnetic stack 124, a polymer layer 130 and the second metal layer 132. The first metal layer 113 is over the passivation layer 110. The magnetic stack 124 is over the first metal layer 113. The polymer layer 130 is over the first metal layer 113 and encapsulates the magnetic stack 124. The second metal layer 132 is over the polymer layer 130.

It is noted that, in some embodiments, the magnetic stack 124 has a substantially zigzag shaped sidewall. In alternative embodiments, the magnetic stack 124 has a substantially sigma shaped (E) sidewall. Specifically, the magnetic stack 124 includes a succession of steps or stairs, and those steps constitute a zigzag or sigma shaped sidewall profile. In some embodiments, the magnetic stack 124 is described as having a zigzag shaped stepped profile through the specification. Such zigzag shaped stepped profile of the magnetic stack 124 is generated by a two-photo-two-etch (2P2E) process, which will be described in details below with reference to FIG. 4A to FIG. 4H.

From another point of view, the magnetic stack 124 is formed with a wide top/shoulder and a narrow middle/waist. Specifically, the magnetic stack 124 can be described as having a narrow-middle profile. In some embodiments, the narrow-middle profile indicates a profile that is narrow in a middle portion thereof. In some embodiments, the dimension of the top portion of the magnetic stack 124 is less than the dimension of the bottom portion of the magnetic stack 124, as shown in FIGS. 1-2. However, the present disclosure in not limited thereto. In alternative embodiments, the dimension of the top portion of the magnetic stack 124 can be substantially equal to or greater than the dimension of the bottom portion of the magnetic stack 124.

In some embodiments, the magnetic stack 124 includes, for example but not limited to, a first stepped structure 122-1 and a second stepped structure 122-2 below the first stepped structure 122-1. Each of the first stepped structure 122-1 and the second stepped structure 122-2 has multiple steps, and the lowermost step of the first stepped structure 122-1 is adjacent to and in physical contact with the uppermost step of the second stepped structure 122-2. In some embodiment, the dimension of a lower step (e.g., the lowermost step) of the first stepped structure 122-1 is greater than the dimension of an upper step (e.g., the uppermost step) of the second stepped structure 122-2, such that a notch N is located on the sidewall of the magnetic stack 124 and at the interface between the first stepped structure 122-1 and the second stepped structure 122-2.

For the sake of simplicity and clarity, the first and second stepped structures 122-1 and 122-2 in FIG. 2 are illustrated as having three steps and two steps, respectively. Such five-step magnetic stack 124 in FIG. 2 is merely an example of the magnetic stack 124 in FIG. 1. In other words, the number of steps of the first stepped structure 122-1 or the second stepped structure 122-2 is not limited by the embodiments of the disclosure.

As shown in FIG. 2, the first stepped structure 122-1 has, from bottom to top, steps 121a to 121c, and the second stepped structure 122-2 has, from bottom to top, steps 123a to 123b. The lowermost step 121a of the first stepped structure 122-1 is adjacent to and in physical contact with the uppermost step 123b of the second stepped structure 122-2, and the dimension of the lowermost step 121a of the first stepped structure 122-1 is greater than the uppermost step 123b of the second stepped structure 122-2.

In some embodiments, the included angle θ1 between a line L1 tangent to a corner of at least one step of the first stepped structure 122-1 and a bottom surface of the first stepped structure 122-1 ranges from about 5 to 60 degrees. Similarly, the included angle θ2 between a line L2 tangent to a corner of at least one step of the second stepped structure 122-2 and a bottom surface of the second stepped structure 122-2 ranges from about 5 to 60 degrees. In some embodiments, the included angle θ1 is substantially equal to the included angle θ2, as shown in FIG. 2. However, the present disclosure in not limited thereto. In alternative embodiments, the included angle θ1 can be greater than or less than the included angle θ2.

The five-step magnetic stack 124 in FIG. 2 is provided for illustration purposes, and is not construed as limiting the disclosure. It should be appreciated by those skilled in the art that the number of steps of the first stepped structure 122-1 or the second stepped structure 122-2 can be adjusted upon the process requirements. In some embodiments, the number of steps of the first stepped structure 122-1 is greater than that of the second stepped structure 122-2. In alternative embodiments, the number of steps of the first stepped structure 122-1 is equal to that of the second stepped structure 122-2. In yet alternative embodiments, the number of steps of the first stepped structure 122-1 is less than that of the second stepped structure 122-2.

In some embodiments, the magnetic stack 124 includes a plurality of unit layers, and each unit layer constitutes a step of the magnetic stack 124. In some embodiments, each unit layer includes, from bottom to top, a conductive etch stop layer 116, a magnetic layer 118 and an insulating etch buffer layer 120.

In some embodiments, the conductive etch stop layer 116 includes metal or metal nitride. In some embodiments, the conductive etch stop layer 116 includes a non-magnetic metal material. For example, the conductive etch stop layer 116 includes Ti, TiN, TiW, W, WN, TaN, a combination thereof, or the like. The conductive etch stop layer 116 may be formed by a suitable method such as PVD CVD or the like.

In some embodiments, the magnetic layer 118 includes a magnetic metal material containing cobalt (Co), zirconium (Zr), tantalum (Ta) and niobium (Nb), rhenium (Re), neodymium (Nd), praseodymium (Pr), dysprosium (Dy) or a combination thereof. In some embodiments, the magnetic layer 118 includes an amorphous cobalt (Co) alloy including cobalt (Co) and zirconium (Zr). Zirconium (Zr) helps to make cobalt (Co) amorphous. In some embodiments, magnetic layer 118 includes a cobalt-zirconium (CoZr) alloy having one or more additional elements, such as tantalum (Ta) and niobium (Nb). In some other embodiments, magnetic layer 118 includes a cobalt-zirconium (CoZr) alloy having one or more additional elements, such as a rare earth element, that helps to increase the ferromagnetic resonance of the cobalt-zirconium (CoZr) alloy. The rare earth element include rhenium (Re), neodymium (Nd), praseodymium (Pr), or dysprosium (Dy). In some embodiments, the magnetic layer 118 includes CoZrTa, CoZr, CoZrRe, NiFe or a combination thereof. The magnetic layer 118 may be formed by a suitable method such as PVD, CVD or the like.

In some embodiments, the insulating etch buffer layer 120 includes metal oxide. In some embodiments, the insulating etch buffer layer 120 includes an oxide of the magnetic metal material of the magnetic layer 118. For example, the insulating etch buffer layer 120 includes an oxide of CoZrTa, CoZr, CoZrRe or NiFe. The insulating etch buffer layer 12 may be formed by a suitable method such as PVD, CVD or the like.

In some embodiments, the thickness of the magnetic layer 118 is at least 20 times the thickness of the conductive etch stop layer 116 or the insulating etch buffer layer 120. For example, the conductive etch stop layer 116, the magnetic layer 118 and the insulating etch buffer layer 120 are in a thickness ratio of about 1:40:2 to 1:50:2.

In some embodiments, the etch selectivity of the magnetic layer 118 to the insulating etch buffer layer 120 is less than the etch selectivity of the magnetic layer 118 to the conductive etch stop layer 116. For example, the etch selectivity of the magnetic layer 118 to the insulating etch buffer layer 120 ranges from about 250:1 to 200:1, and the etch selectivity of the magnetic layer 118 to the conductive etch stop layer 116 ranges from about 250:1 to 200:1.

The magnetic stack 124 is insulated from the post-passivation interconnect structure PPI by the polymer layer 130 and an insulating layer 115. In some embodiments, the insulating layer 115 is disposed between the bottom of the magnetic stack 124 and the first metal layer 113. In some embodiments, the insulating layer 115 includes silicon oxide, silicon nitride, silicon oxynitride or a combination thereof. The insulating layer 115 may be formed by a suitable method such as CVD, ALD, PVD, thermal oxidation or the like. In some embodiments, the polymer layer 130 encapsulates the sidewall and top of the magnetic stack 124. In some embodiments, the polymer layer 130 may be formed of a polymer such as an epoxy, polyimide, benzocyclobutene (BCB), polybenzoxazole (PBO) or the like. The polymer layer 130 may be formed by a suitable method such as spin-coating, lamination, deposition or the like.

In some embodiments, another polymer layer 134 is further included in the inductor structure 1/1a. The polymer layer 134 is formed on the polymerlayer 130 and encapsulates the second metal layer 132. In some embodiments, the polymer layer 134 may be formed of a polymer such as an epoxy, polyimide, benzocyclobutene (BCB), polybenzoxazole (PBO) or the like. The material of the polymer layer 134 can be the same as or different from that of the polymer layer 130. The polymer layer 134 may be formed by a suitable method such as spin-coating, lamination, deposition or the like.

In some embodiments, after the inductor structure 1 is formed in the first area 10, an under bump metallization (UBM) layer 138 and a bump 140 are formed over the substrate 100 in the second area 20.

In some embodiments, the polymer layer 130 is further formed on the substrate 100 in the second area 20. In some embodiments, a planarization step may be performed to the polymer layer 130, such that the top surface of the polymer layer 130 in the first area 10 is substantially coplanar with the top surface of the polymer layer 130 in the second area 20, as shown in FIG. 1. The planarization step includes an etching back process, a chemical mechanical polishing (CMP) process or both.

In some embodiments, when the second metal layer 132 is formed on the polymer layer 130 in the first area 10, two connecting pads P are formed at two ends of the spiral structure (as shown in FIG. 3) in the second area 20. Besides, the polymer layer 134 is further formed on the connecting pads P in the second area 20.

The UBM layer 138 is formed over and electrically connected to the connecting pads P. In some embodiments, the UBM layer 138 includes copper, nickel, titanium, a combination thereof, or the like, and is formed by an electroplating process. The bump 140 is formed over and electrically connected to the UBM layer 138. In some embodiments, the bump 140 includes a conductive material with low resistivity, such as Sn, Pb, Ag, Cu, Ni, Bi or an alloy thereof, and may be formed by a suitable process such as evaporation, plating, ball drop, or screen printing. A semiconductor structure including the inductor structure 1/1a and the bump 140 is thus completed.

The method of forming a magnetic stack with a zigzag shaped stepped profile will be described in details below with reference to FIG. 4A to FIG. 4H. FIG. 4A to FIG. 4H are schematic cross-sectional views of a method of forming an inductor structure in accordance with some embodiments.

Figure 4A:
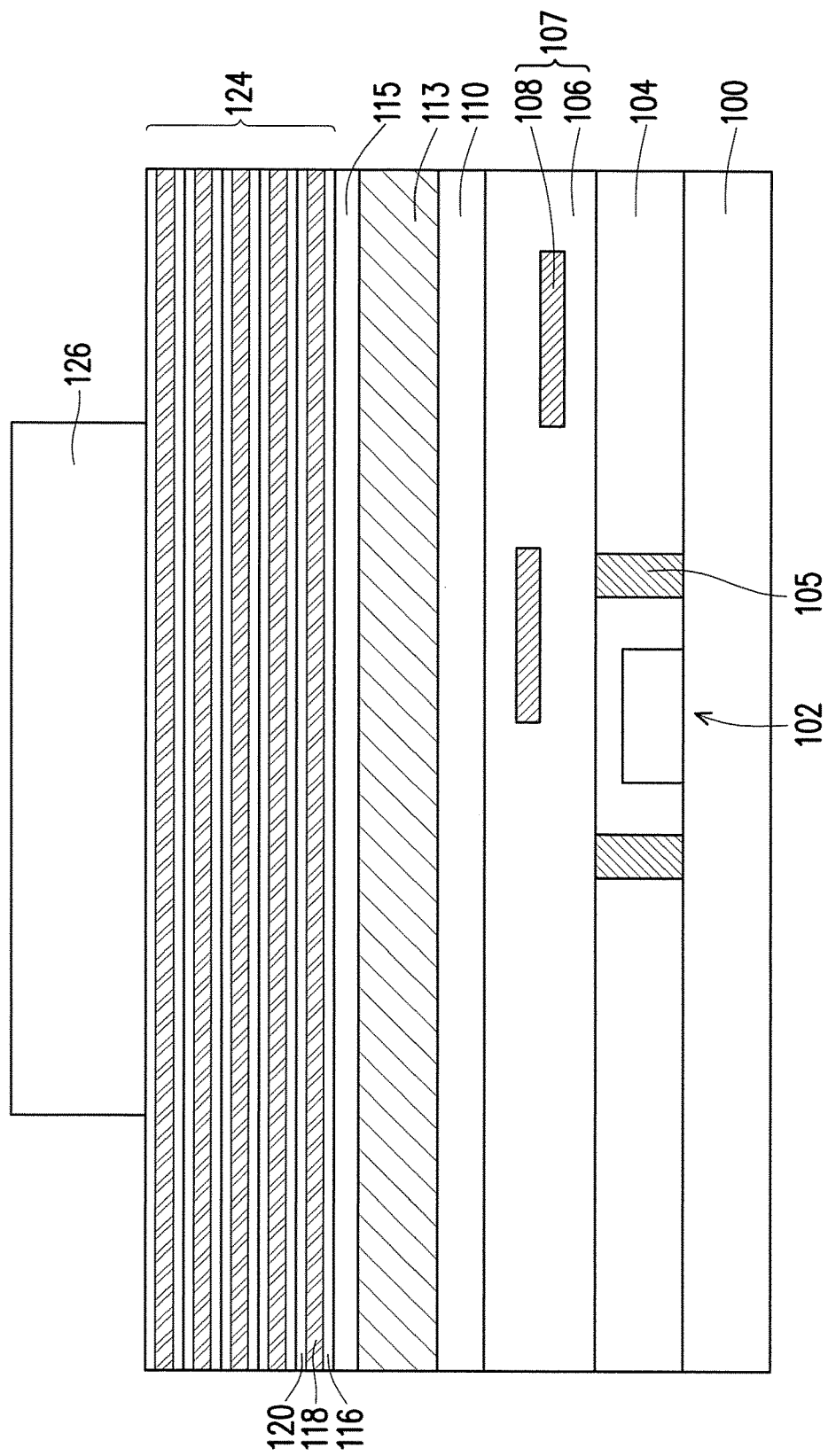
FIG. 4A to FIG. 4H are schematic cross-sectional views of a method of forming an inductor structure in accordance with some embodiments.

Referring to FIG. 4A, a substrate 100 is provided with an electrical circuit 102, contacts 105, an interconnect structure 107 and a passivation layer 110 thereon. Thereafter, a first metal layer 113 is formed on the passivation layer 110, and an insulating layer 115 is formed on the first metal layer 113. The materials, dispositions and forming methods of these elements have been described above, and the details are not iterated herein.

Afterwards, a magnetic stack 124 is blanket-formed on the first metal layer 113 with the insulating layer 115 interposed therebetween. In some embodiments, the magnetic stack 124 includes a plurality unit layers. In some embodiments, each unit layer includes, from bottom to top, a conductive etch stop layer 116, a magnetic layer 118 and an insulating etch buffer layer 120. The materials and forming methods of the conductive etch stop layer 116, the magnetic layer 118 and the insulating etch buffer layer 120 have been described above, and the details are not iterated herein.

Continue referring to FIG. 4A, a first photolithography step is performed to form a first photoresist layer 126 on the magnetic stack 124. In some embodiments, the method of forming the first photoresist layer 126 includes coating a photoresist material on the magnetic stack 124, exposing the photoresist material with a photolithography mask (or called photomask), and developing the exposed photoresist material. In some embodiments, the first photoresist layer 126 includes a positive photoresist material which is photo-solubilized when exposed to light. In alternative embodiments, the first photoresist layer 126 includes a negative photoresist material.

Figure 4B:
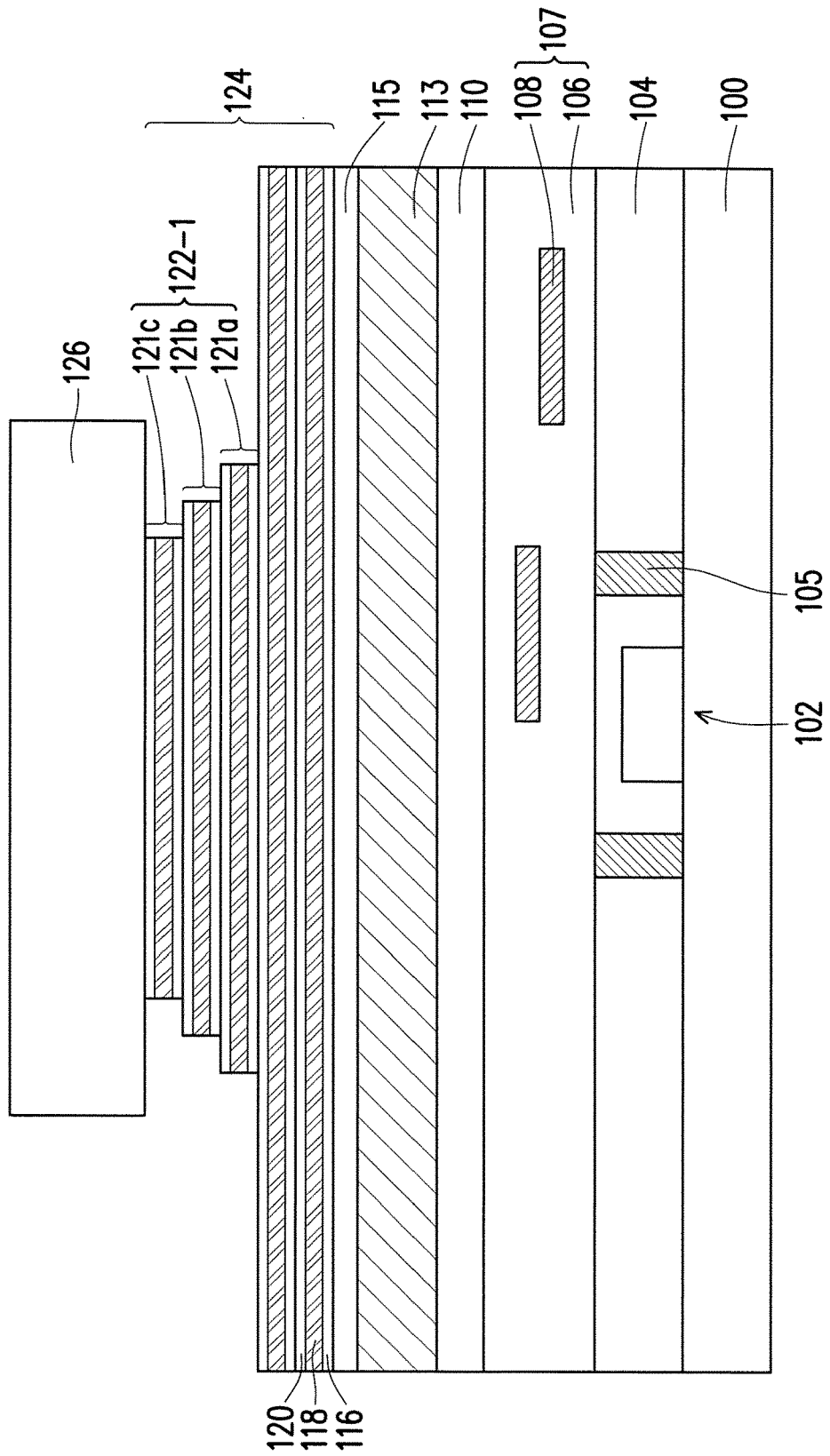
Figure 4C:
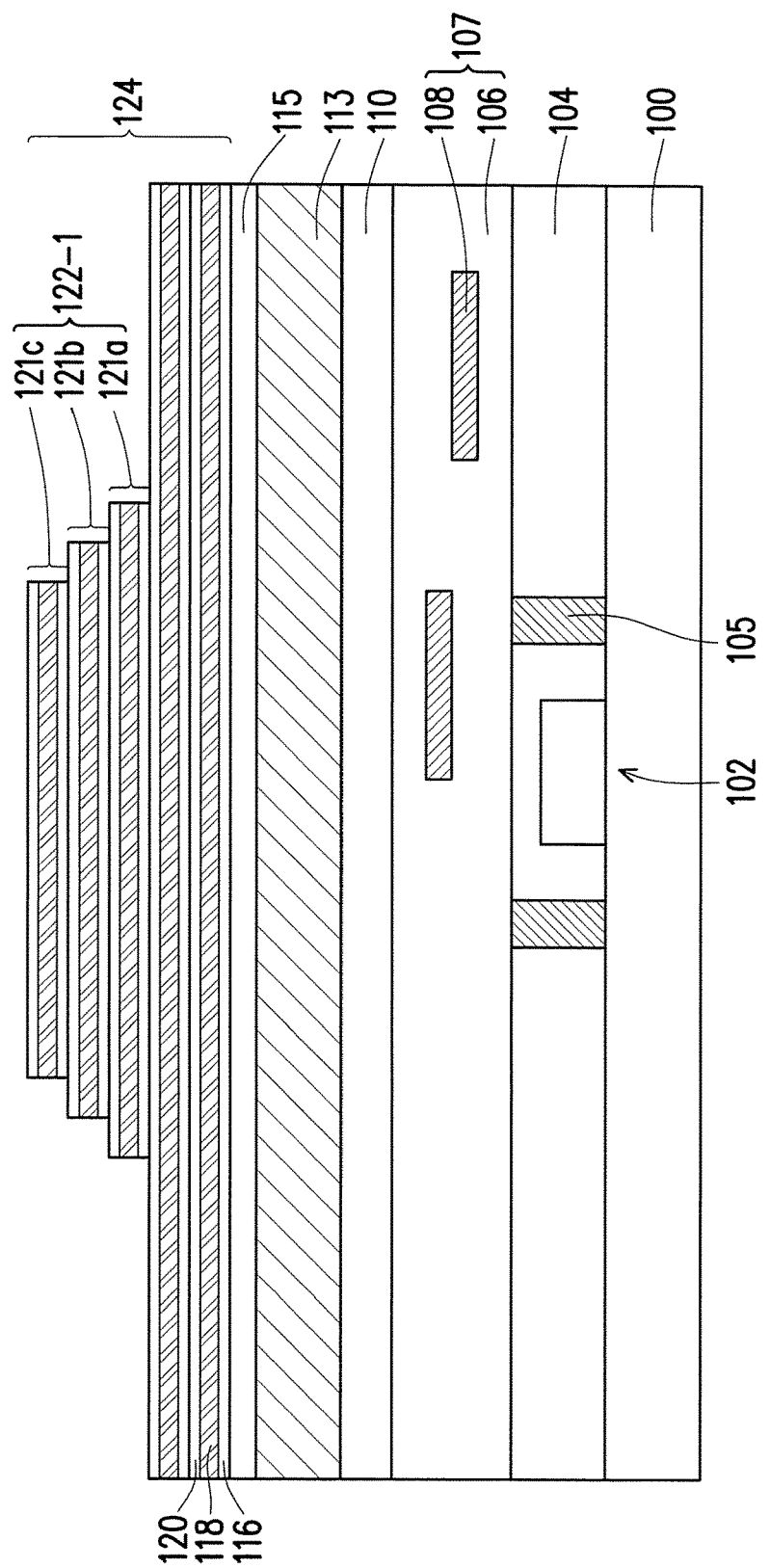

Referring to FIG. 4B and FIG. 4C, a first etching step is performed to an upper portion of the magnetic stack 124 by using the first photoresist layer 126 as an etch mask, so the upper portion is etched to form a first stepped structure 122-1. In some embodiments, the first etching step is a wet etching step used to partially remove the upper portion of magnetic stack 124. In some embodiments, an etching solution used in the first etching step includes an acid solution containing $HNO_3$, $HCl$, $H_2O_2$, $HF$ or a combination thereof. In some embodiments, the etching solution includes $HNO_3$, $HCl$ and $H_2O_2$. In alternative embodiments, the etching solution includes $HF$, $HNO_3$ and water.

In some embodiments, as shown in FIG. 4B, a lateral etching rate of the first etching step in X-direction is larger than a vertical etching rate of the first etching step in Y-direction. Therefore, a lateral portion of the magnetic stack 124 is etched more than a vertical portion of the same magnetic stack 124. By appropriately controlling the etching time, the upper portion of the magnetic stack 124 is patterned to form the first stepped structure 122-1, while the lower portion of the magnetic stack 124 remains substantially intact. In some embodiments, the first stepped structure 122-1 has a succession of steps, and the upper step has a dimension less than that of the lower step. Specifically, as shown in FIG. 4B, the first stepped structure 122-1 has, from bottom to top, steps 121a to 121c, and the dimensions of the steps 121a to 121c are gradually reduced toward the first photoresist layer 126. After the first stepped structure 122-1 is formed, the first photoresist layer 126 is removed, as shown in FIG. 4C.

Figure 4D:
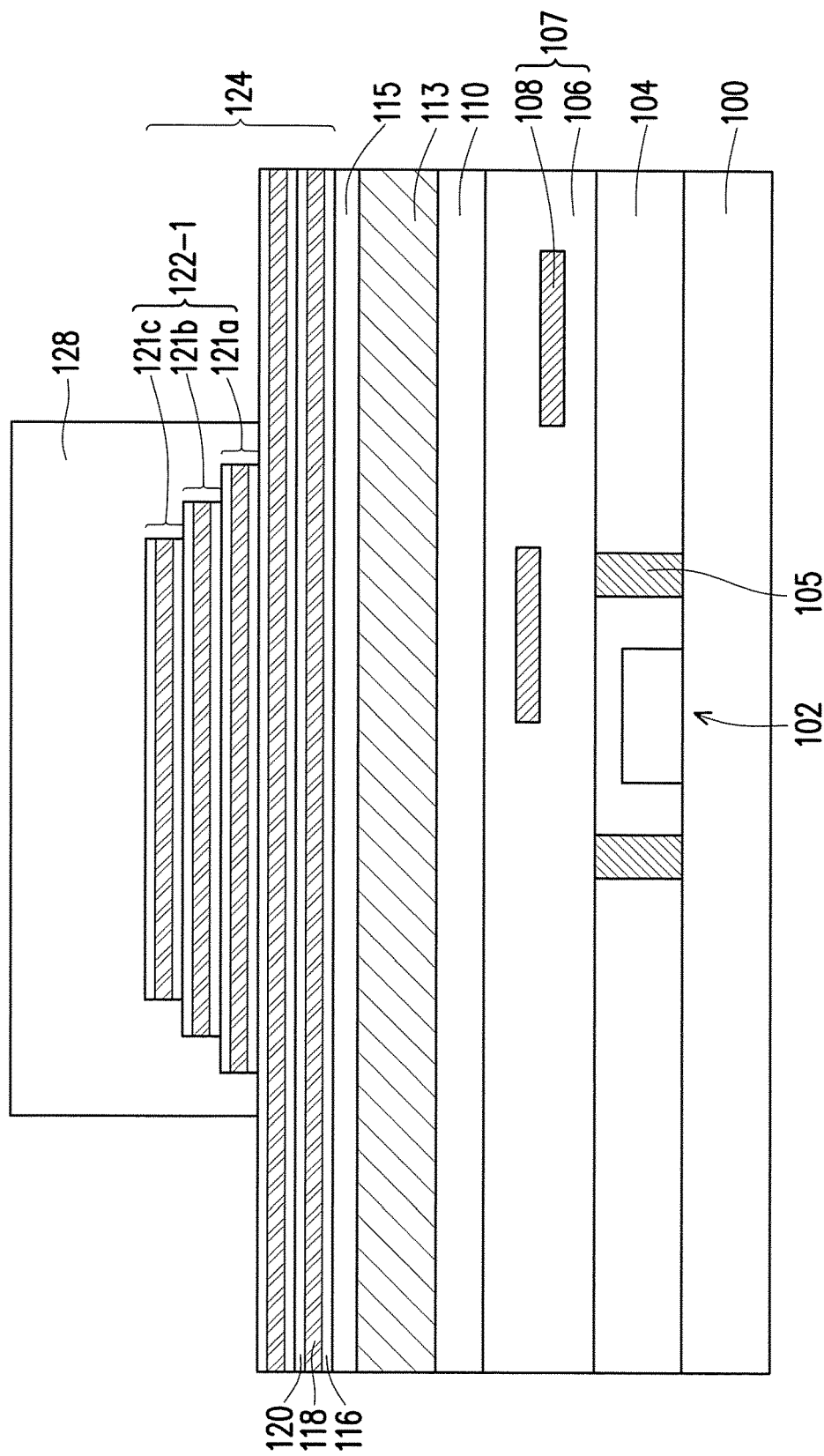

Referring to FIG. 4D, a second photolithography step is performed to form a second photoresist layer 128 that covers the first stepped structure 122-1 and exposes the lower portion of the magnetic stack 124. In some embodiments, the method of forming the second photoresist layer 128 includes coating a photoresist material on the magnetic stack 124, exposing the photoresist material with a photolithography mask, and developing the exposed photoresist material. In some embodiments, the second photoresist layer 128 includes a positive photoresist material which is photo-solubilized when exposed to light. In alternative embodiments, the second photoresist layer 128 includes a negative photoresist material.

In some embodiments, the first and second photoresist layers 126 and 128 are defined with the same photolithography mask. In some embodiments, the photolithography recipe for the second photolithography step is the same as that for the first photolithography step. That is, the first and second photolithography steps are performed using the same process parameters. For example, the first and second photolithography steps are performed using the same photoresist material, the same photolithography mask, the same exposure energy and the same development time. In alternative embodiments, at least one of the process parameters is different in the first and second photolithography steps.

Figure 4E:
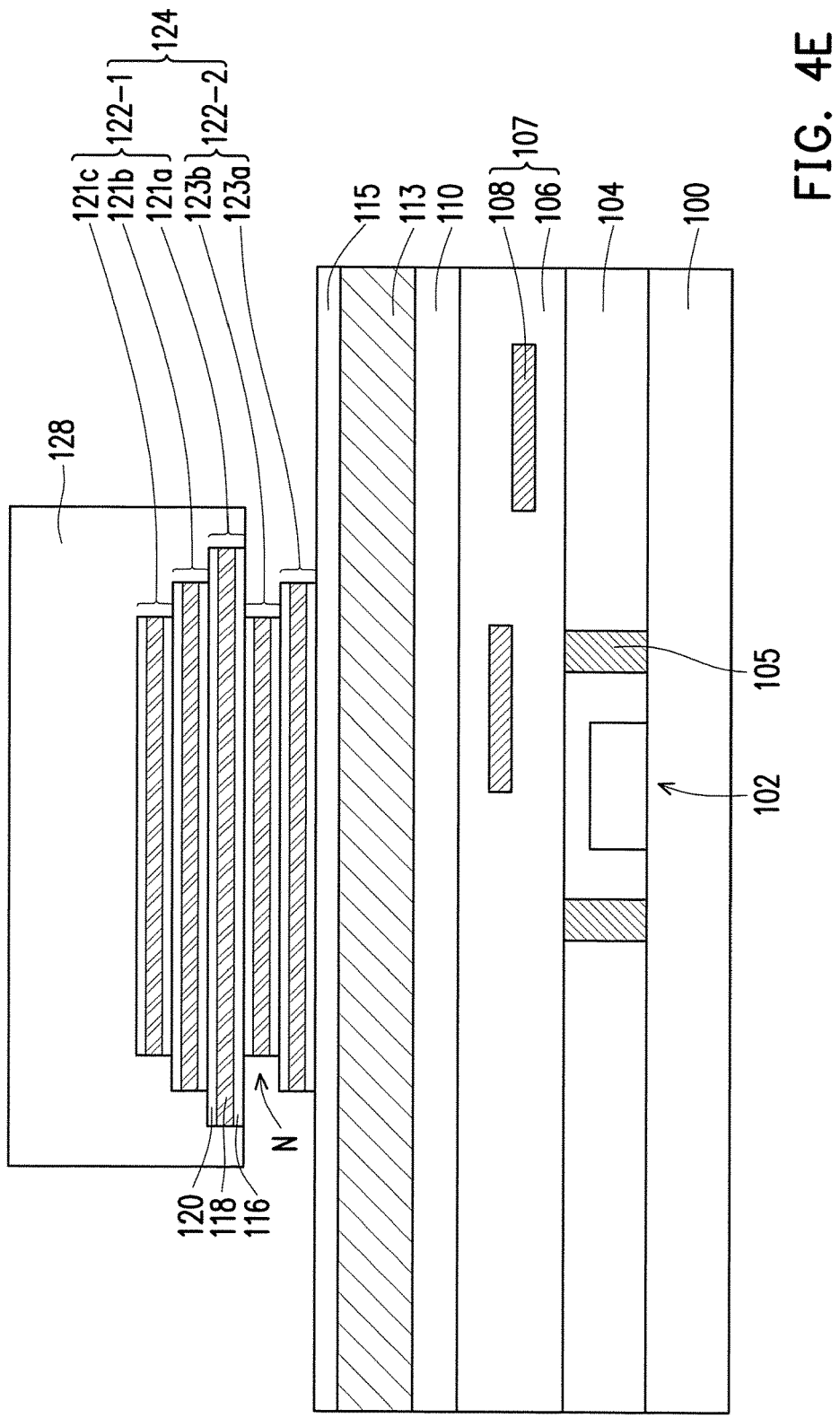
Figure 4F:
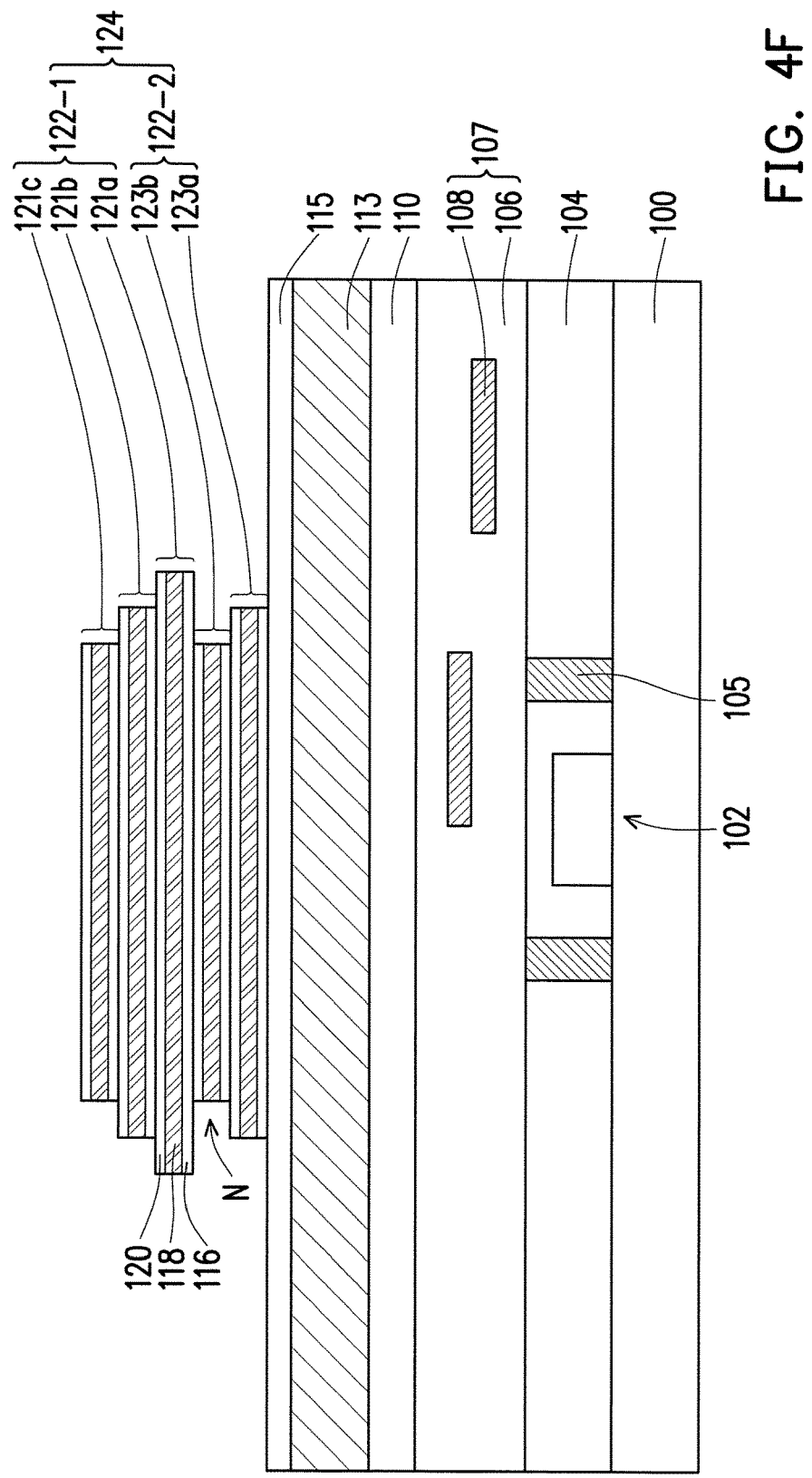

Referring to FIG. 4E and FIG. 4F, a second etching step is performed to the lower portion of the magnetic stack 124 by using the second photoresist layer 128 as an etch mask, so the lower portion is etched to form a second stepped structure 122-2 that is below the first stepped structure 122-1.

In some embodiments, the second etching step is a wet etching step used to partially remove the lower portion of magnetic stack 124. In some embodiments, an etching solution used in the second etching step includes an acid solution containing $HNO_3$, $HCl$, $H_2O_2$, $HF$ or a combination thereof. In some embodiments, the etching solution includes $HNO_3$, $HCl$ and $H_2O_2$. In alternative embodiments, the etching solution includes $HF$, $HNO_3$ and water.

In some embodiments, as shown in FIG. 4E, a lateral etching rate of the second etching step in X-direction is larger than a vertical etching rate of the second etching step in Y-direction. Therefore, a lateral portion of the magnetic stack 124 is etched more than a vertical portion of the same magnetic stack 124. By appropriately controlling the etching time, the lower portion of the magnetic stack 124 is patterned to form the second stepped structure 122-2. In some embodiments, the second stepped structure 122-2 has a succession of steps, and the upper step has a dimension less than that of the lower step. Specifically, as shown in FIG. 4E, the second stepped structure 122-2 has, from bottom to top, steps 123a to 123b, and the dimensions of the steps 123a to 123b are gradually reduced toward the second photoresist layer 128. After the second stepped structure 122-2 is formed, the second photoresist layer 128 is removed, as shown in FIG. 4F.

In some embodiments, the first etching step and the second etching step are performed with the same etching solution. The etching time for the second etching step may be the same or different from that for the first etching step, depending on the number of steps of the first stepped structure 122-1 or the second stepped structure 122-2. In alternative embodiments, the first etching step and the second etching step are performed with different etching solutions as needed.

Figure 4G:
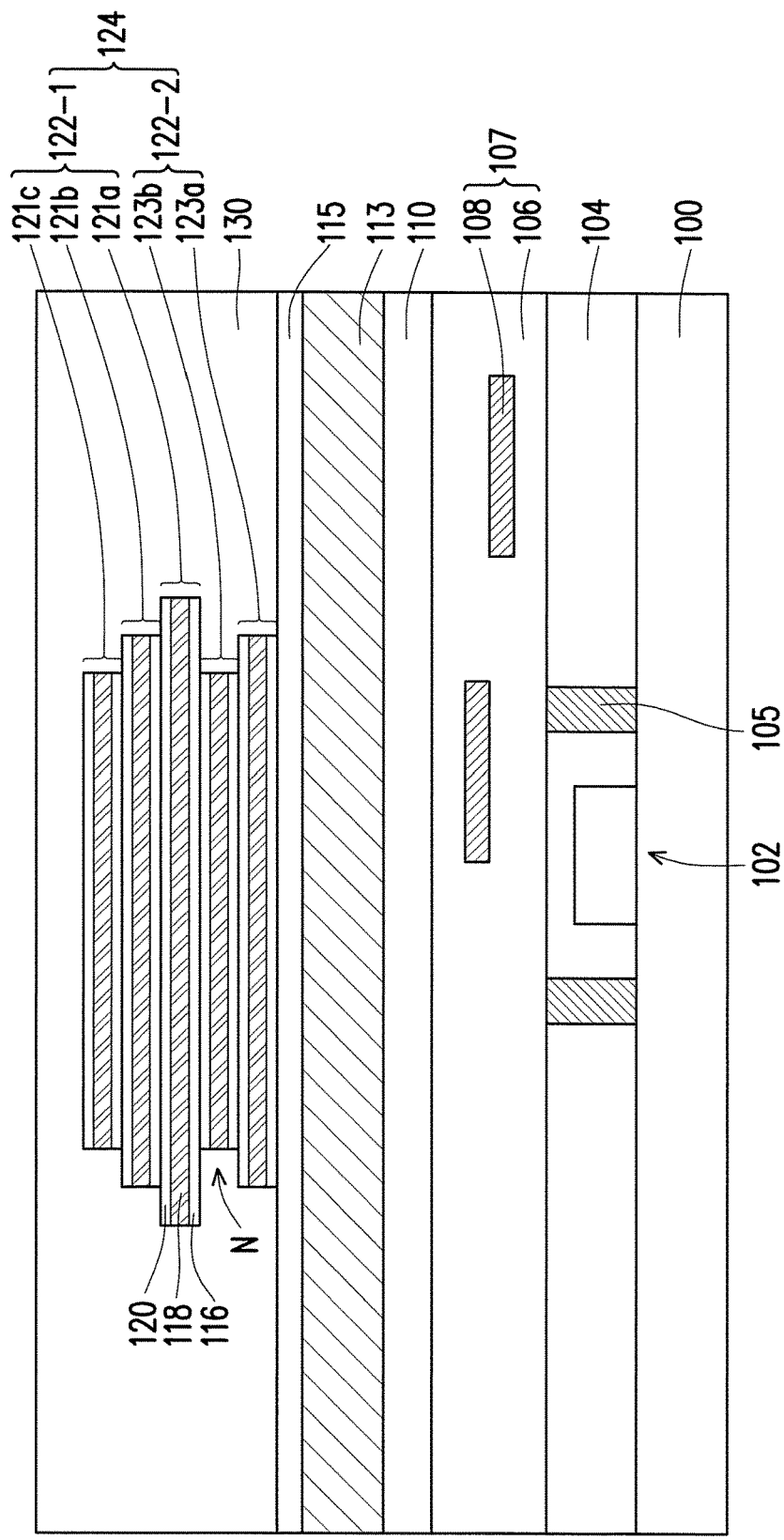

Referring to FIG. 4G, a polymer layer 130 is formed over the substrate 100 and covers the first and second stepped structures 122-1 and 122-2.

Figure 4H:
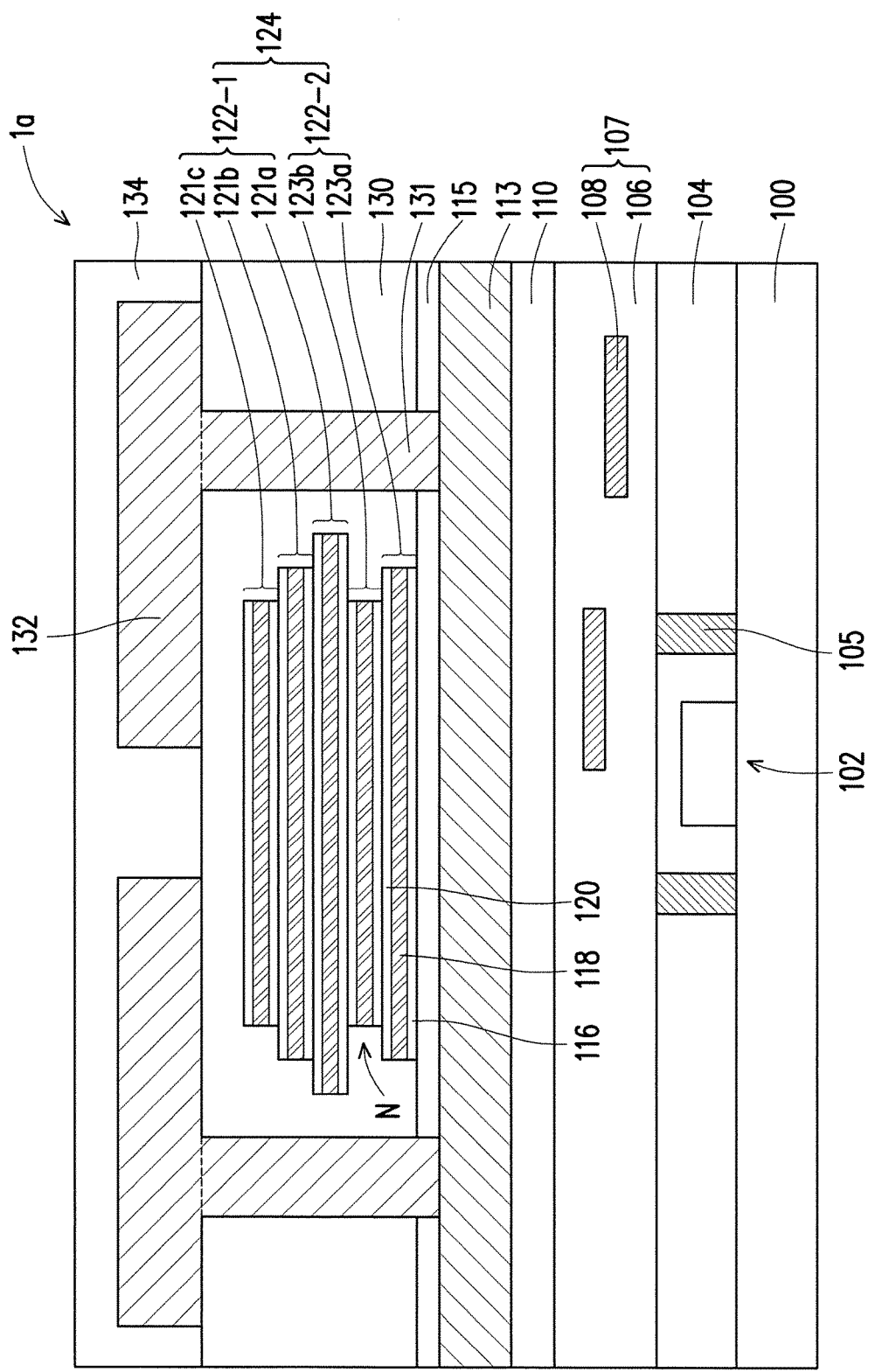

Referring to FIG. 4H, a second metal layer 132 is formed over the polymer layer 130. In some embodiments, openings are formed in the polymer layer 130 by photolithography and etching processes. Conductive materials are filled into the openings to form vias 131 and the second metal layer 132. The second metal layer 132 is electrically connected to the first metal layer 113 through the vias 131. In some embodiments, another polymer layer 134 is formed on the polymer layer 130 and encapsulates the second metal layer 132. An inductor structure 1a is thus completed.

In some embodiments, the first metal layer 113, the vias 131 and the second metal layer 132 constitute a spiral structure, as shown in FIG. 3. The magnetic stack 124 formed by a 2P2E process described in FIGS. 4A-4F is disposed in a central portion of the inductor structure 1a and surrounded by the spiral structure.

Figure 5:
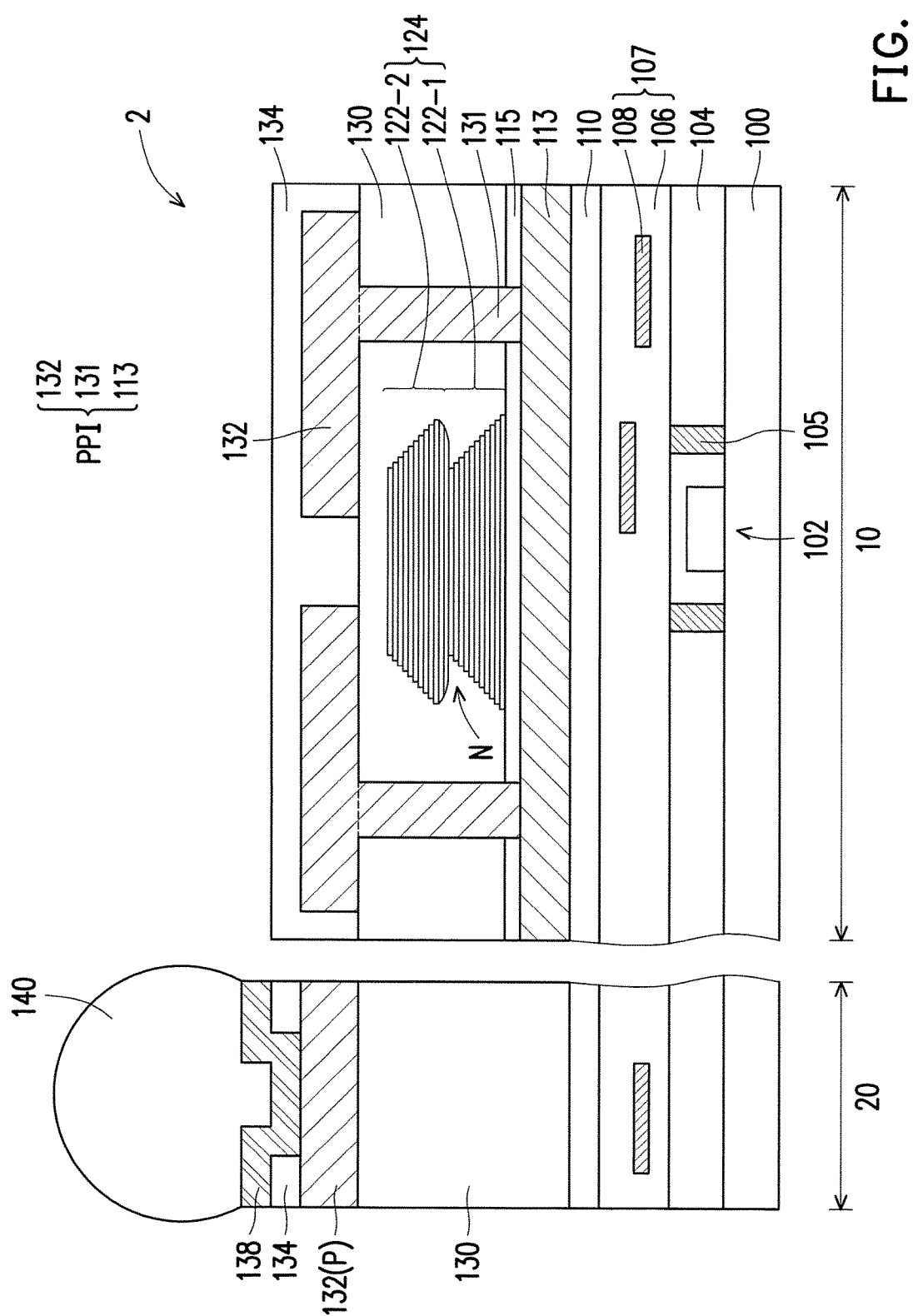
FIG. 5 is a schematic cross-sectional view of a semiconductor device in accordance with alternative embodiments.
Figure 6:
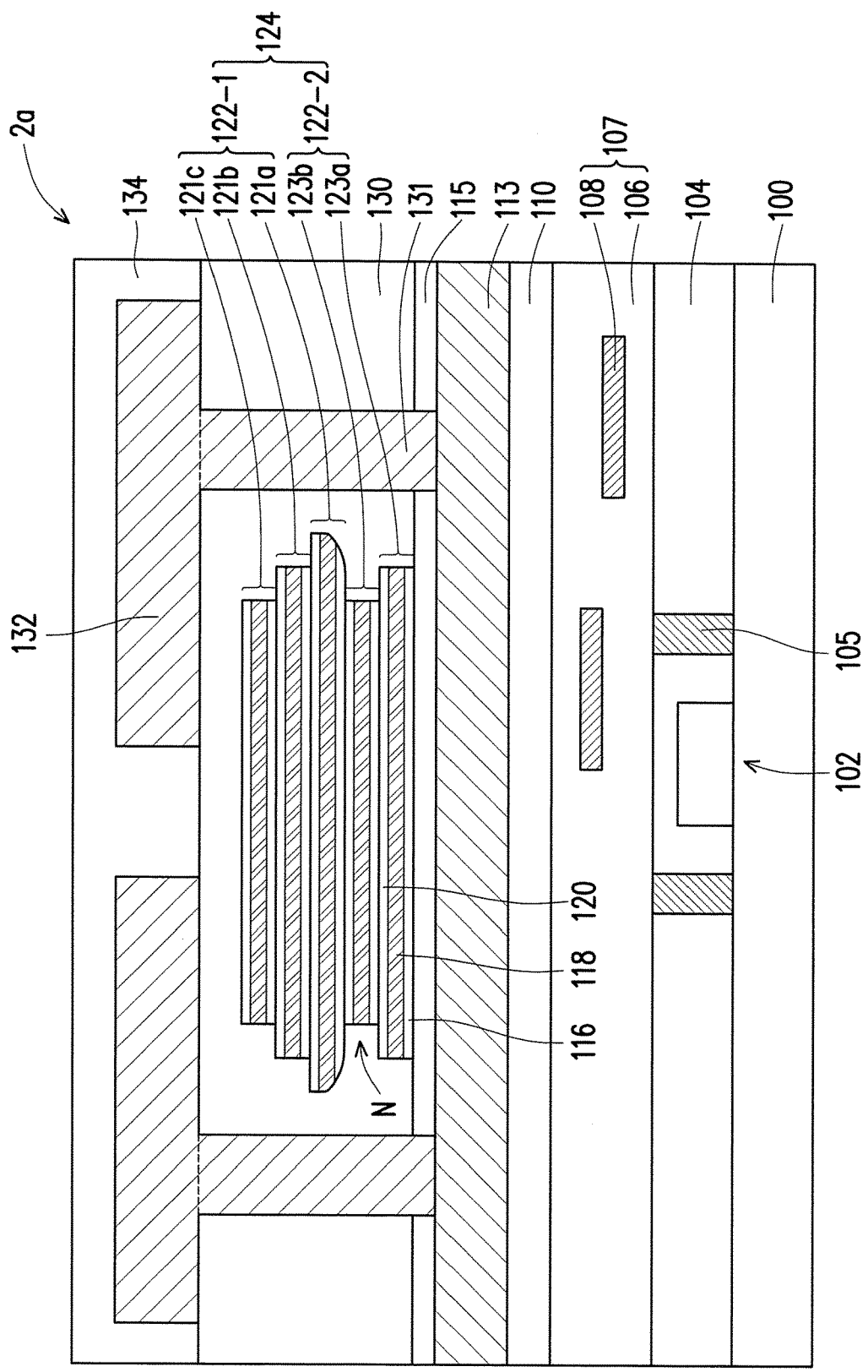
FIG. 6 is a schematic cross-sectional view of an inductor structure in accordance with alternative embodiments.

FIG. 5 is a schematic cross-sectional view of a semiconductor device in accordance with alternative embodiments. FIG. 6 is a schematic cross-sectional view of an inductor structure in accordance with alternative embodiments.

The inductor structure 2/2a of FIGS. 5-6 is similar to the inductor structure 1/1a of FIGS. 1-2, and the difference between them lies in the shape of the first stepped structure 122-1. Specifically, the first stepped structure 122-1 of the inductor structure 1/1a of FIGS. 1-2 has a substantially flat bottom surface, while the first stepped structure 122-1 of the inductor structure 2/2a of FIGS. 5-6 has a curved or arc bottom surface. In some embodiments, when the lower portion of the magnetic stack 124 is partially removed by the etching solution of the second etching step for defining the second stepped structure 122-2 (FIG. 4E), edge portion(s) of the lower step(s) of the first stepped structure 122-1 are simultaneously removed by the same etching solution.

Figure 7:
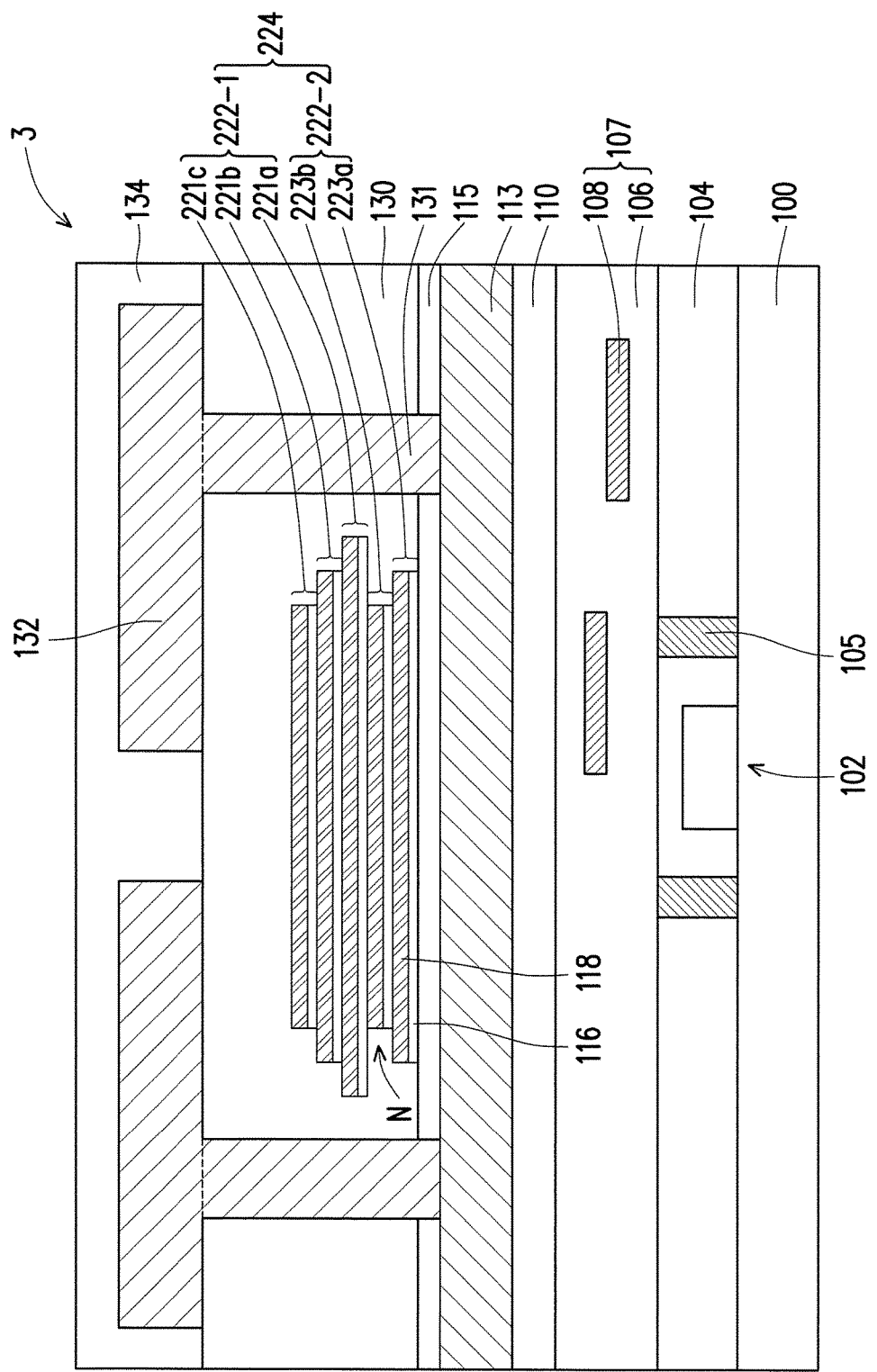
FIG. 7 is a schematic cross-sectional view of an inductor structure in accordance with yet alternative embodiments.

FIG. 7 is a schematic cross-sectional view of an inductor structure in accordance with yet alternative embodiments.

The inductor structure 3 of FIG. 7 is similar to the inductor structure 1a of FIG. 2, and the difference between them lies in the unit layers of the magnetic stack. Specifically, each unit layer of the magnetic stack 124 in FIG. 2 has a t layer sandwich structure, while each unit layer of the magnetic stack 224 in FIG. 7 has a dual-layer structure. Each unit layer of the magnetic stack 224 in FIG. 7 includes a conductive etch stop layer 116 and a magnetic layer 118 on the conductive etch stop layer 116. Specifically, the magnetic stack 224 in FIG. 7 includes a plurality of conductive etch stop layers 116 and a plurality of magnetic layers 118 alternatively stacked.

Figure 8:
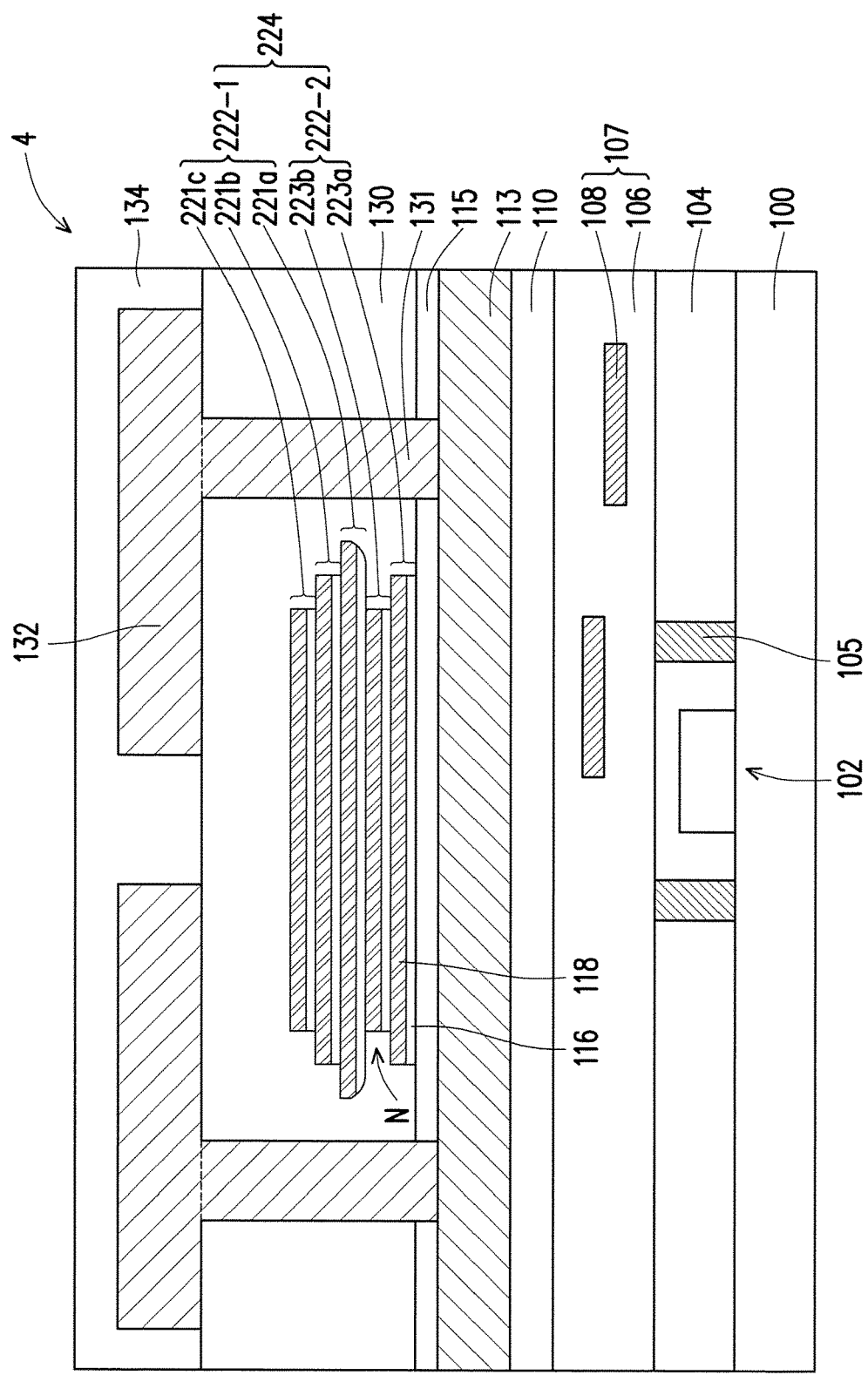
FIG. 8 is a schematic cross-sectional view of an inductor structure in accordance with yet alternative embodiments.

FIG. 8 is a schematic cross-sectional view of an inductor structure in accordance with yet alternative embodiments.

The inductor structure 4 of FIG. 8 is similar to the inductor structure 2a of FIG. 6, and the difference between them lies in the unit layers of the magnetic stack. Specifically, each unit layer of the magnetic stack 124 in FIG. 6 has a tri-layer sandwich structure, while each unit layer of the magnetic stack 224 in FIG. 8 has a dual-layer structure. Each unit layer of the magnetic stack 224 in FIG. 8 includes a conductive etch stop layer 116 and a magnetic layer 118 on the conductive etch stop layer 116. Specifically, the magnetic stack 224 in FIG. 8 includes a plurality of conductive etch stop layers 116 and a plurality of magnetic layers 118 alternatively stacked.

It is noted that, the magnetic stack 124/224 of the inductor structure 1/1a/2/2a/3/4 is defined by a 2P2E process rather than the conventional one-photo-one-etch (1P1E) process, and such 2P2E process helps to minimize the volume loss caused by the etching solution.

Specifically, the magnetic stack of the conventional inductor structure is defined by a 1P1E process. The lateral etching rate of the etching step in X-direction is larger than the vertical etching rate of the etching step in Y-direction. Therefore, the volume of the conventional magnetic stack is significantly decreased because the etching time of the single etching step has to be long enough to define the conventional magnetic stack. The performance of the conventional inductor structure is decreased due to the small volume of conventional magnetic stack. For example, a Q factor of the conventional inductor structure is decreased.

However, in some embodiments of the disclosure, the magnetic stack 124 is defined by a 2P2E process, so the total etching time can be significantly reduced, and therefore, the magnetic stack 124/224 is formed with a larger volume. As a result, the performance of inductor structure 1/1a/2/2a/3/4 of the disclosure has a better performance (high Q factor).

The above embodiments in which a 2P2E is performed to define a magnetic stack are provided for illustration purposes, and are not construed as limiting the present disclosure. It should be appreciated by those skilled in the art that a multiple-photo-multiple-etch process, such as a three-photo-three-etch (3P3E) process, can be performed upon the process requirements.

Figure 9:
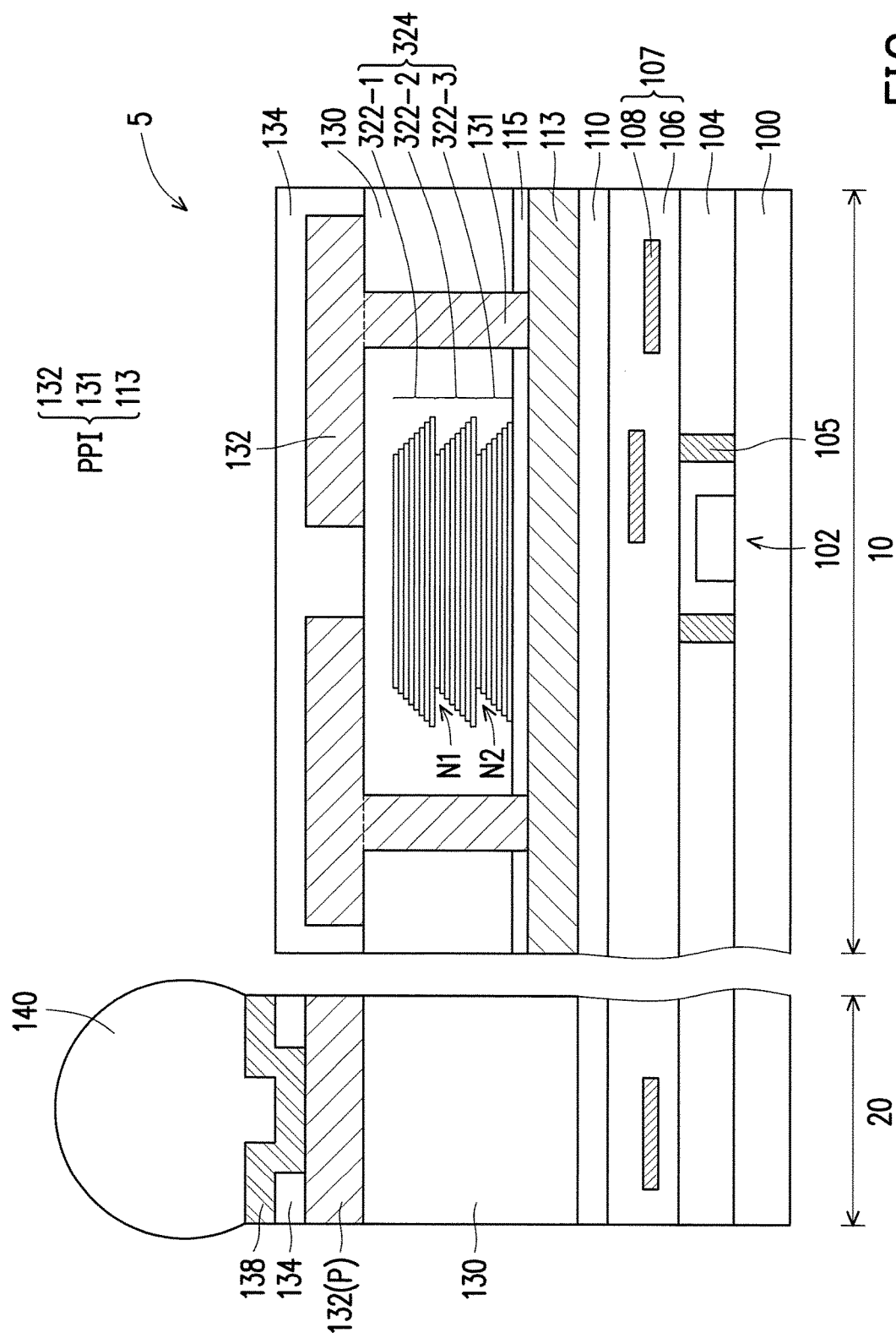
FIG. 9 is a schematic cross-sectional view of a semiconductor device in accordance with still alternative embodiments.
Figure 10:
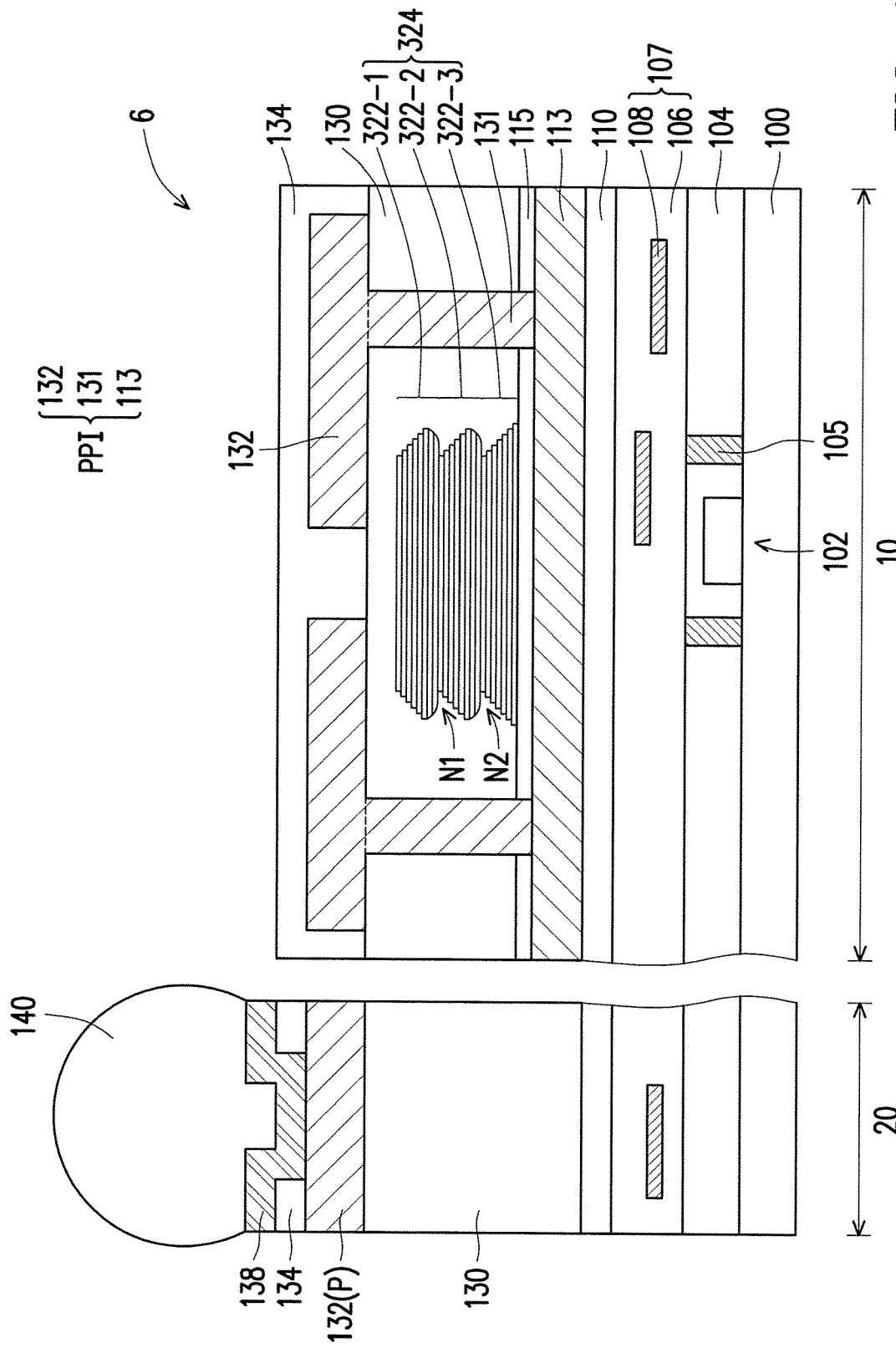
FIG. 10 is a schematic cross-sectional view of a semiconductor device in accordance with still alternative embodiments.

FIG. 9 is a schematic cross-sectional view of a semiconductor device in accordance with still alternative embodiments. FIG. 10 is a schematic cross-sectional view of a semiconductor device in accordance with still alternative embodiments.

Upon the 3P3E process, the magnetic stack 324 is formed with a substantially zigzag shaped sidewall. Specifically, the magnetic stack 324 includes, for example but not limited to, a first stepped structure 322-1, a second stepped structure 322-2 below the first stepped structure 322-1, and a third stepped structure 322-3 below the second stepped structure 322-2. Each of the first, second and third stepped structures 322-1, 322-2 and 322-3 has multiple steps, the lowermost step of the first stepped structure 322-1 is adjacent to and in physical contact with the uppermost step of the second stepped structure 322-2, and the lowermost step of the second stepped structure 322-2 is adjacent to and in physical contact with the uppermost step of the third stepped structure 322-3. In some embodiment, the dimension of a lower step (e.g., the lowermost step) of the first stepped structure 322-1 is greater than the dimension of an upper step (e.g., the uppermost step) of the second stepped structure 322-2, such that a notch N1 is located on the sidewall of the magnetic stack 324 and at the interface between the first stepped structure 322-1 and the second stepped structure 322-2. Similarly, the dimension of a lower step (e.g., the lowermost step) of the second stepped structure 322-2 is greater than the dimension of an upper step (e.g., the uppermost step) of the third stepped structure 322-3, such that a notch N2 is located on the sidewall of the magnetic stack 324 and at the interface between the second stepped structure 322-2 and the third stepped structure 322-3.

In some embodiments, the first, second and third stepped structure 322-1, 322-2 and 322-3 of the magnetic stack 324 all have a substantially flat bottom surface, as shown in FIG. 9.

In alternative embodiments, the first and second stepped structures 322-1 and 322-2 of the magnetic stack 324 has a curved or arc bottom surfaces, while the third stepped structure 322-3 of the magnetic stack 324 has a substantially flat bottom surface, as shown in FIG. 10. In some embodiments, when the middle portion of the magnetic stack 324 is partially removed by the etching solution of the second etching step for defining the second stepped structure 322-2, and edge portion(s) of the lower step(s) of the first stepped structure 322-1 are simultaneously removed by the same etching solution. Similarly, when the lower portion of the magnetic stack 324 is partially removed by the etching solution of the third etching step for defining the third stepped structure 322-3, and edge portion(s) of the lower step(s) of the second stepped structure 322-2 are simultaneously removed by the same etching solution.

In accordance with some embodiments of the present disclosure, a semiconductor device includes an inductor structure. The inductor structure is on a substrate and includes a first metal layer, a magnetic stack, a polymer layer and a second metal layer. The first metal layer is over the substrate. The magnetic stack is over the first metal layer and has a substantially zigzag shaped sidewall. The polymer layer is over the first metal layer and encapsulates the magnetic stack. The second metal layer is over the polymer layer.

In accordance with alternative embodiments of the present disclosure, a method of foaming an inductor structure includes at least the following steps. A first metal is formed layer on a substrate. A magnetic stack is formed on the first metal layer. A first photolithography step is performed to form a first photoresist layer on the magnetic stack. A first etching step is performed to an upper portion of the magnetic stack by using the first photoresist layer as an etch mask, such that the upper portion is etched to form a first stepped structure. A second photolithography step is performed to form a second photoresist layer that covers the first stepped structure and exposes the lower portion of the magnetic stack. A second etching step is performed to the lower portion of the magnetic stack by using the second photoresist layer as an etch mask, such that the lower portion is etched to form a second stepped structure below the first stepped structure. A polymer layer is formed over the substrate and covers the first and second stepped structures. A second metal layer is formed over the polymer layer.

In accordance with yet alternative embodiments of the present disclosure, a semiconductor device includes a substrate, an inductor structure and a bump. The substrate has a first area and a second area. The inductor structure is disposed on the substrate in the first area. The inductor structure includes a post-passivation interconnect structure over the substrate and being a spiral, and a magnetic stack in a central region of the spiral and having a first notch on a sidewall thereof. The bump is disposed on the substrate in the second area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    an inductor structure on a substrate and comprising:
        a first metal layer over the substrate;
        a magnetic stack over the first metal layer and having a substantially zigzag shaped sidewall;
        a polymer layer over the first metal layer and encapsulating a top and a sidewall of the magnetic stack; and
        a second metal layer over the polymer layer.

2. The semiconductor device of claim 1, wherein the magnetic stack comprises a first stepped structure and a second stepped structure below the first stepped structure, and a dimension of a lower step of the first stepped structure is greater than a dimension of an upper step of the second stepped structure.

3. The semiconductor device of claim 2, wherein an included angle between a line tangent to a corner of at least one step of the first stepped structure and a bottom surface of the first stepped structure ranges from about 5 to 60 degrees.

4. The semiconductor device of claim 2, wherein the first stepped structure has a curved bottom surface.

5. The semiconductor device of claim 1, wherein the magnetic stack comprises a plurality of unit layers, and each of the unit layers comprises a conductive etch stop layer and a magnetic layer on the conductive etch stop layer.

6. The semiconductor device of claim 5, wherein the conductive etch stop layer comprises Ti, TiN, TiW, W, WN, TaN or a combination thereof, and the magnetic layer comprises a magnetic metal material containing Co, Zr, Ta, Nb, Re, Nd, Pr, Dy or a combination thereof.

7. The semiconductor device of claim 5, wherein each of the unit layers further comprises an insulating etch buffer layer on the magnetic layer, and the insulating etch stop layer comprises an oxide of the magnetic metal material.

8. The semiconductor device of claim 1, wherein the second metal layer is electrically connected to the first metal layer through a plurality of vias, and the first metal layer, the vias and the second metal layer constitute a spiral structure.

9. A method of forming an inductor structure, comprising:
    forming a first metal layer on a substrate;
    forming a magnetic stack on the first metal layer;
    performing a first photolithography step to form a first photoresist layer on the magnetic stack;
    performing a first etching step to an upper portion of the magnetic stack by using the first photoresist layer as an etch mask, such that the upper portion is etched to form a first stepped structure;

performing a second photolithography step to form a second photoresist layer that covers the first stepped structure and exposes a lower portion of the magnetic stack;

performing a second etching step to the lower portion of the magnetic stack by using the second photoresist layer as an etch mask, such that the lower portion is etched to form a second stepped structure below the first stepped structure;

forming a polymer layer over the substrate, wherein the polymer layer covers the first stepped structure and the second stepped structure; and forming a second metal layer over the polymer layer.

10. The method of claim 9, wherein each of the first etching step and the second etching step comprises a wet etching step.

11. The method of claim 9, wherein the first etching step and the second etching step are performed with the same etching solution.

12. The method of claim 9, wherein the first photoresist layer and the second photoresist layer are defined with the same photolithography mask.

13. The method of claim 9, wherein a dimension of a lower step of the first stepped structure is greater than a dimension of an upper step of the second stepped structure.

14. The method of claim 9, wherein the magnetic stack comprises a plurality of unit layers, and each of the unit layers comprises a conductive etch stop layer and a magnetic layer on the conductive etch stop layer.

15. The method of claim 14, wherein each of the unit layers further comprises an insulating etch buffer layer on the magnetic layer.

16. A semiconductor device, comprising:
a substrate has a first area and a second area,
an inductor structure disposed on the substrate in the first area and comprising:
 a post-passivation interconnect structure over the substrate and being a spiral; and
 a magnetic stack in a central region of the spiral and having a first notch on a sidewall thereof; and
a bump disposed on the substrate in the second area.

17. The semiconductor device of claim 16, wherein the magnetic stack comprises a first stepped structure and a second stepped structure, and the first notch is at an interface between the first stepped structure and the second stepped structure.

18. The semiconductor device of claim 17, wherein the magnetic stack further has a second notch on the sidewall thereof, the magnetic stack further comprises a third stepped structure adjacent to the second stepped structure, and the second notch is at an interface between the second stepped structure and the third stepped structure.

19. The semiconductor device of claim 16, wherein the magnetic stack comprises a plurality of unit layers, and each of the unit layers comprises, from bottom to top, a conductive etch stop layer, a magnetic layer and an insulating etch buffer layer.

20. The semiconductor device of claim 16, wherein the magnetic stack comprises a plurality of conductive etch stop layers and a plurality of magnetic layers alternatively stacked.

* * * * *